(12) United States Patent
Kim

(10) Patent No.: US 12,431,184 B2
(45) Date of Patent: Sep. 30, 2025

(54) MEMORY SYSTEM

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/358,587

(22) Filed: Jul. 25, 2023

(65) Prior Publication Data

US 2023/0402086 A1  Dec. 14, 2023

Related U.S. Application Data

(63) Continuation of application No. 17/531,424, filed on Nov. 19, 2021, now Pat. No. 11,749,333.

(60) Provisional application No. 63/123,703, filed on Dec. 10, 2020.

(30) Foreign Application Priority Data

Nov. 11, 2021 (KR) .......................... 10-2021-0154680

(51) Int. Cl.
*G11C 11/406* (2006.01)
*G06F 12/0811* (2016.01)
*G06F 12/14* (2006.01)
*G11C 29/42* (2006.01)
*G11C 29/44* (2006.01)

(52) U.S. Cl.
CPC .... *G11C 11/40622* (2013.01); *G06F 12/0811* (2013.01); *G06F 12/1433* (2013.01); *G11C 11/40615* (2013.01); *G11C 29/42* (2013.01); *G11C 29/4401* (2013.01)

(58) Field of Classification Search
CPC ........ G11C 11/40622; G11C 11/40615; G11C 29/42; G11C 19/4401; G06F 12/0811; G06F 12/1433
USPC ......................................................... 365/222
See application file for complete search history.

(56) References Cited

U.S. PATENT DOCUMENTS 9,411,730 B1 *   8/2016  Daly ................... G06F 12/0815
10,824,560 B2 *  11/2020  Hoogerbrugge ..... G06F 12/1441
11,043,254 B2 *  6/2021  Enomoto ............. G11C 11/408
2008/0072004 A1  3/2008  Kershaw
(Continued)

FOREIGN PATENT DOCUMENTS

CN            1522410 A        8/2004
CN          103377169 B  *    12/2016   ....... G06F 15/17387
(Continued)

OTHER PUBLICATIONS

Office Action for Chinese Patent Application No. 202111482681.6 issued by the Chinese Patent Office on Nov. 29, 2024.
(Continued)

*Primary Examiner* — Ly D Pham
(74) *Attorney, Agent, or Firm* — IP & T GROUP LLP

(57) ABSTRACT

A memory system includes: a normal memory area suitable for storing normal data; a security memory area suitable for storing security data; a first row hammer detection circuit suitable for sampling and counting a portion of rows that are activated in the normal memory area to select first rows that need to be refreshed; and a second row hammer detection circuit suitable for counting all rows that are activated in the security memory area to select second rows that need to be refreshed.

7 Claims, 3 Drawing Sheets

(56) References Cited

U.S. PATENT DOCUMENTS

| | | | |
|---|---|---|---|
| 2010/0325445 A1* | 12/2010 | McKeen | G06F 21/52 711/163 |
| 2013/0111605 A1* | 5/2013 | Maeda | G06F 21/14 726/26 |
| 2014/0033217 A1* | 1/2014 | Vajda | G06F 9/3842 718/102 |
| 2014/0177370 A1* | 6/2014 | Halbert | G11C 11/40611 365/222 |
| 2014/0281206 A1* | 9/2014 | Crawford | G11C 11/40611 711/106 |
| 2016/0041783 A1 | 2/2016 | Choi et al. | |
| 2017/0060637 A1* | 3/2017 | Persson | G06F 21/55 |
| 2017/0186481 A1* | 6/2017 | Oh | G11C 11/406 |
| 2018/0061476 A1* | 3/2018 | Kim | G11C 11/4078 |
| 2018/0342281 A1* | 11/2018 | Yoo | G11C 11/4085 |
| 2019/0333573 A1* | 10/2019 | Shin | G11C 11/40618 |
| 2020/0050400 A1 | 2/2020 | Kim et al. | |
| 2020/0066329 A1* | 2/2020 | Son | G11C 11/40611 |
| 2021/0012832 A1* | 1/2021 | Devaux | G06F 13/1668 |
| 2021/0064743 A1* | 3/2021 | Hush | G11C 17/16 |
| 2021/0174866 A1* | 6/2021 | Chung | G11C 11/4076 |
| 2021/0264999 A1* | 8/2021 | Bains | G11C 7/24 |
| 2021/0287736 A1* | 9/2021 | Park | G11C 11/40611 |

FOREIGN PATENT DOCUMENTS

| | | | | |
|---|---|---|---|---|
| CN | 107068174 A | | 8/2017 | |
| CN | 110168644 A | | 8/2019 | |
| CN | 110348204 A | * | 10/2019 | ......... G06F 12/1408 |
| CN | 111863062 A | | 10/2020 | |

OTHER PUBLICATIONS

Office Action for Chinese Patent Application No. 202111482681.6 issued by the Chinese Patent Office on May 6, 2025.

Office Action for Taiwanese Patent Application No. 110145995 issued by the Taiwanese Patent Office on Apr. 22, 1 2025.

* cited by examiner

| ROW | Activation Number |
|---|---|
| K+1 | 0 time |
| K+2 | 120 times |
| K+3 | 7 times |
| K+4 | 348 times |
| ... | |
| N | 0 time |

MEMORY SYSTEM

CROSS-REFERENCE TO RELATED APPLICATIONS

The present application is a continuation of U.S. patent application Ser. No. 17/531,424 filed on Nov. 19, 2021, which claims priority to U.S. Provisional Patent Application No. 63/123,703, filed on Dec. 10, 2020, and Korean Patent Application No. 10-2021-0154680, filed on Nov. 11, 2021, which are incorporated herein by reference in its entirety.

BACKGROUND

1. Field

Various embodiments of the present invention relate to a memory system.

2. Description of the Related Art

As the degree of integration of memories increases, the spacing between a plurality of word lines included in a memory decreases. As the spacing between word lines decreases, the coupling effect between the neighboring word lines increases.

Moreover, whenever data is input or output to or from a memory cell, a word line toggles between an active state and an inactive state. As the coupling effect between the neighboring word lines increases, data stored in a memory cell coupled to a word line which is disposed adjacent to a frequently activated word line may be damaged (i.e., lost). This phenomenon is referred to as 'word line disturbance' or 'row hammering'. It is a concern that data of a memory cell may be damaged due to the row hammering before the memory cell is refreshed.

FIG. 1 is a schematic diagram for describing row hammering.

In FIG. 1, 'WLL' denotes a word line that is activated an excessive number of times (i.e., excessively), and 'WLL−1' and 'WLL+1' denote word lines that are disposed adjacent to the word line 'WLL'. Further, 'CL' denotes a memory cell coupled to the excessively activated word line 'WLL', and 'CL−1' and 'CL+1' denote memory cells coupled to the adjacent word lines 'WLL−1' and 'WLL+1', respectively. Each memory cell includes a cell transistor TL, TL−1, or TL+1 and a cell capacitor CAPL, CAPL−1, or CAPL+1. Further, 'BL0' and 'BL1' denote bit lines.

When the word line 'WLL' is activated or deactivated, voltage levels of the adjacent word lines 'WLL−1' and 'WLL+1' may increase or decrease due to the coupling effect occurring between the excessively activated word line 'WLL' and the adjacent word lines 'WLL−1' and 'WLL+1', thus affecting an amount of charges stored in the cell capacitors CL−1 and CL+1. Therefore, the more the word line 'WLL' toggles between an activated state and an inactive state, the more the variation in the amount of charges stored in the cell capacitors CAPL−1 and CAPL+1 of the adjacent memory cells 'CL−1' and 'CL+1' increases, which results in deterioration of data stored in the memory cells.

In addition, electromagnetic waves generated while a word line toggles between an active state and an inactive state may corrupt data by charging electrons into or discharging electrons from a cell capacitor of a memory cell that is coupled to a neighboring word line.

To resolve the concerns of row hammering, a method of detecting a row (i.e., a word line) that has been activated multiple times and refreshing neighboring rows of the row that has been activated multiple times is mainly used.

SUMMARY

Embodiments of the present invention are directed to improving the capability of defending a memory system from a row hammering attack.

In accordance with an embodiment of the present invention, a memory system includes: a normal memory area suitable for storing normal data; a security memory area suitable for storing security data; a first row hammering detection circuit suitable for sampling a portion of rows that are activated in the normal memory area and counting activation numbers of the sampled rows to select first rows to be refreshed among the sampled rows; and a second row hammering detection circuit suitable for counting activation numbers of all rows in the security memory area to select second rows to be refreshed.

In accordance with another embodiment of the present invention, a memory system includes: a memory including a normal area suitable for storing normal data and a security area suitable for storing security data; and a host including: an error correction code storing region suitable for storing an error correction code corresponding to the security data; and an error correction circuit suitable for correcting an error of data that are read from the security area based on the error correction code stored in the error correction code storing region.

In accordance with yet another embodiment of the present invention, a memory system includes: a normal memory area suitable for storing normal data; a security memory area suitable for storing security data; and a processor including a cache memory, wherein the security memory area is allowed to be accessed, by the processor, only via the cache memory.

In accordance with still another embodiment of the present invention, a memory system includes: a normal memory area suitable for storing normal data; a security memory area suitable for storing security data; a first row hammering detection circuit suitable for sampling a portion of rows that are activated in the normal memory area and counting activation numbers of the sampled rows to select first rows to be refreshed; a second row hammering detection circuit suitable for counting activation numbers of all rows in the security memory area to select second rows to be refreshed; a cache memory suitable for storing an error correction code corresponding to the security data; and an error correction circuit suitable for correcting an error of data that are read from the security memory area based on an error correction code stored in the cache memory.

In accordance with still yet another embodiment of the present invention, a memory system includes: a memory including: a normal area suitable for storing normal data, a security area suitable for storing security data, and a first row hammering detection circuit suitable for counting activation numbers of rows of the normal area in a random-row counting manner to detect rows to be refreshed; and a processor including: a second row hammering detection circuit suitable for counting activation numbers of rows of the security area in a full-row counting manner to detect rows to be refreshed.

DETAILED DESCRIPTION

Figure 1:
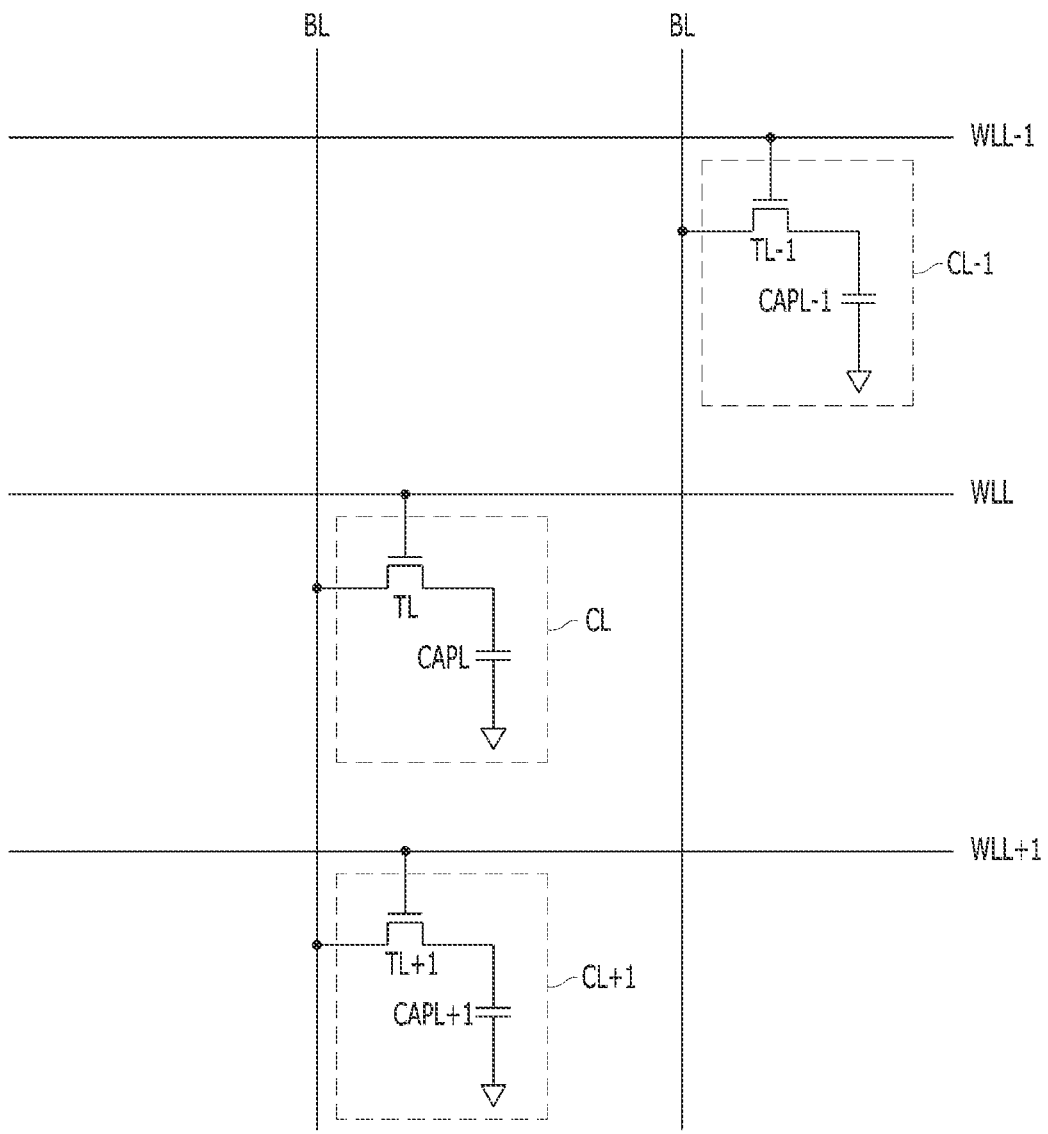
FIG. 1 is a schematic diagram for describing row hammering.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
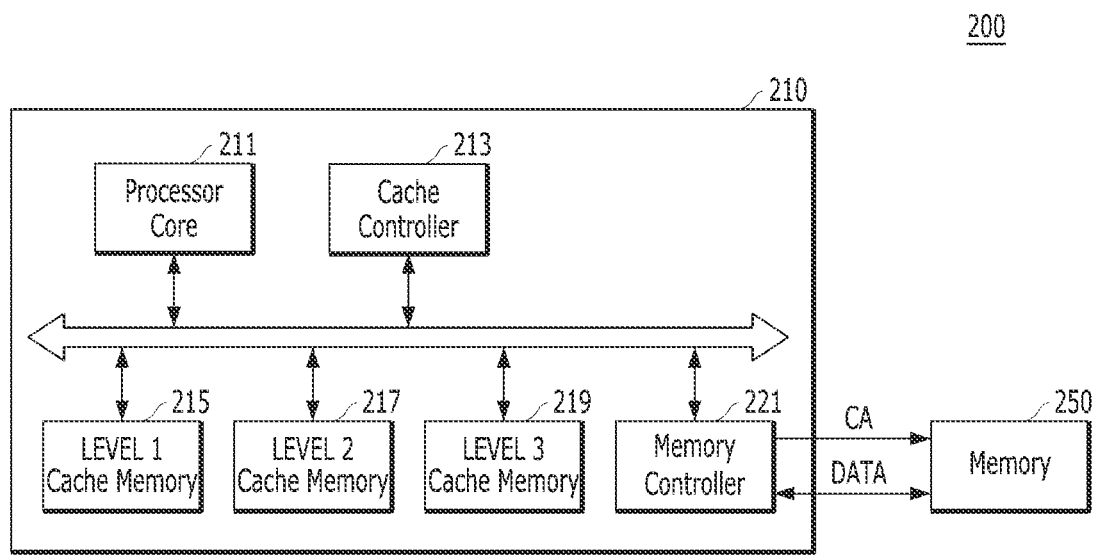
FIG. 2 is a block diagram illustrating a memory system in accordance with an embodiment of the present invention.

FIG. 2 is a block diagram illustrating a memory system 200 in accordance with an embodiment of the present invention.

Referring to FIG. 2, the memory system 200 may include a processor 210 and a memory 250.

The processor 210 may include a processor core 211, a cache controller 213, diverse levels of cache memories 215, 217 and 219, and a memory controller 221. The components included in the processor 210 may communicate through a memory bus 223. The processor 210 may be an entity that processes data or signals. Examples of the processor 210 may include a microprocessor, a Central Processing Unit (CPU), a Graphic Processing Unit (GPU), an Application Processor (AP), a Digital Signal Processor (DSP) and the like.

The processor core 211 may include circuits that process instructions of a computing system. The processor core 211 may be a single or multi-core. The processor core 211 may use the diverse levels of cache memories 215, 217 and 219 to access data stored in the memory 250.

The cache memories 215, 217 and 219 may be divided into several levels. The lower a level of a cache memory is, the faster an operation speed may be, but a capacity of the cache memory may become small. The cache controller 213 may manage the cache memories 215, 217 and 219 and determine whether to obtain the data for the processor core 211 from one cache memory among the cache memories 215, 217 and 219 or from the memory 250. The processor core 211 may preferentially obtain needed data from the cache memories 215, 217 and 219. When the needed data are not cached in the cache memories 215, 217 and 219, the processor core 211 may obtain the needed data from the memory 250 via the memory controller 221.

The memory controller 221 may control an operation of the memory 250. The processor 210 may access the memory 250 via the memory controller 221. That is, the processor 210 may write data to the memory 250 and read data stored in the memory 250 via the memory controller 221. The memory controller 221 may transfer a command/address CA to the memory 250 to control the operation of the memory 250 and may transfer and receive data DATA to and from the memory 250.

Here, although it is illustrated herein that the memory controller 221 is included in the processor 210, it would be apparent to those skilled in the art that the memory controller 221 may exist outside the processor 210. A device including the memory controller 221 in the memory system 200 is generally referred to as a host. Therefore, in FIG. 2, the processor 210 may be a host.

The memory 250 may perform an operation instructed by the memory controller 221. The memory 250 may be one among random access memories, such as Dynamic Random Access Memory (DRAM), Static RAM (SRAM), Phase-Change RAM (PCRAM), Magnetic RAM (MRAM), Resistive RAM (ReRAM), and the like. It may also be another type of a memory that requires a refresh operation. For example, memories in which data are likely to be lost due to row hammering may be the memory 250.

Figure 3:
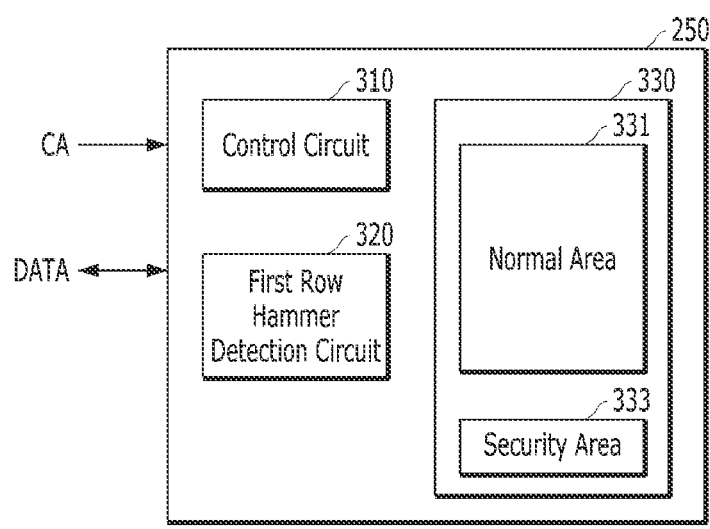
FIG. 3 is a detailed block diagram illustrating a memory shown in FIG. 2 in accordance with an embodiment of the present invention.

FIG. 3 is a detailed block diagram illustrating the memory 250 shown in FIG. 2 in accordance with an embodiment of the present invention.

Referring to FIG. 3, the memory 250 may include a control circuit 310, a first row hammering detection circuit 320, and a cell array 330.

The control circuit 310 may control the overall operation of the memory 250. The control circuit 310 may control the internal constituent elements of the memory 250 so that the memory may perform the operations instructed by the command/address CA, for example, an active operation, a precharge operation, a read operation, a write operation, and a refresh operation.

The cell array 330 may include a plurality of memory cells that are arranged in a plurality of rows and a plurality of columns. The cell array 330 may include a normal area 331 and a security area 333. The normal area 331 may be a memory cell area (i.e., a storage area or a memory area) for storing general data, and the security area 333 may be a memory cell area for storing security-important data. Since the normal area 331 and the security area 333 are for distinguishing different policies applied thereto, the normal area 331 and the security area 333 may be distinguished by addresses. For example, when the number of rows of the cell array is N+1, the normal area 331 may range from a row 0 to a row K, and the security area 333 may range from a row K+1 to a row N. Since the security area 333 may store only a portion of security-important data, a size of the security area 333 may be much smaller than a size of the normal area 331. For example, the size of the normal area 331 may be tens to thousands of times the size of the security area 333.

The first row hammering detection circuit 320 may select rows to be refreshed by sampling a portion of rows that are activated in the cell array 330 to count the activation numbers of the sampled rows. To be specific, there may be innumerable rows that are activated in the cell array 330, and the first row hammering detection circuit 320 may detect excessively activated rows by randomly sampling some of the numerous rows that are activated in the cell array 330 to count the activation numbers of the sampled rows. Further, the neighboring rows of the excessively activated rows, that is, rows that are likely to lose data due to row hammering, may be classified as rows to be refreshed.

The first row hammering detection circuit 320 does not count the activation numbers of all the rows that are activated in the cell array 330 but counts the activation numbers of only some of the sampled rows. This is because it is difficult for the first row hammering detection circuit 320 to count the activation numbers of all of the activated rows in the cell array 330, and it is too burdensome to embody such a circuit in terms of the area and current consumption. The rows that are classified as rows that need to be refreshed by the first row hammering detection circuit 320 may be preferentially or additionally refreshed during a normal refresh operation, or may be refreshed when a command is applied, e.g., a refresh management command.

The rows that are likely to lose data due to row hammering in the security area 333 in the cell array 330 may be classified by the memory controller 221 as the rows to be refreshed. Therefore, the first row hammering detection circuit 320 may exclude the security area 333 from subjects of management and select rows to be refreshed by sampling a portion of the activated rows only in the normal area 231 to count the activation numbers of the sampled rows.

Figures 4, 5:
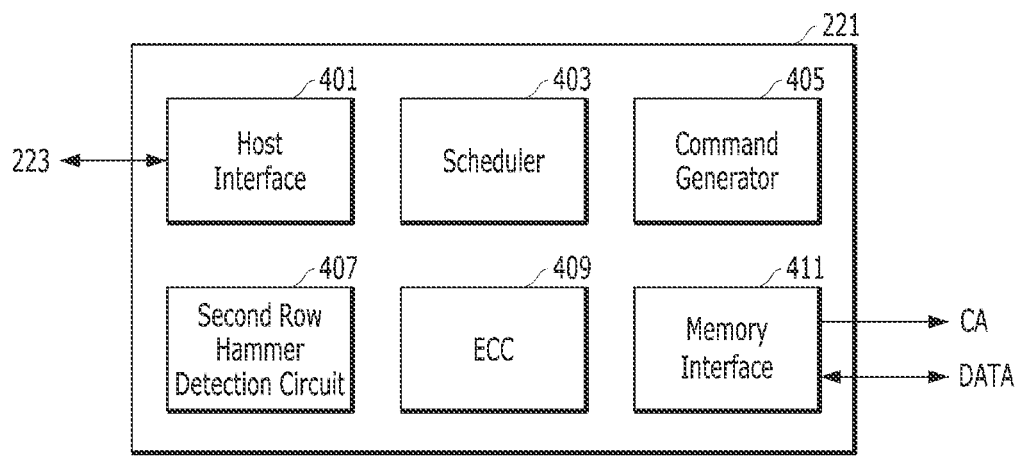
FIG. 4 is a detailed block diagram illustrating a memory controller shown in FIG. 2 in accordance with an embodiment of the present invention.
FIG. 5 is a table showing an example of a counting result stored in a last-level cache memory, shown in FIG. 2 in accordance with an embodiment of the present invention.

FIG. 4 is a detailed block diagram illustrating the memory controller 221 shown in FIG. 2 in accordance with an embodiment of the present invention.

Referring to FIG. 4, the memory controller 221 may include a host interface 401, a scheduler 403, a command generator 405, a second row hammering detection circuit 407, an error correction circuit (ECC) 409, and a memory interface 411.

The host interface 401 may be used for an interface between the memory controller 221 and the other constituent elements of the processor 210. The memory controller 221 may be coupled to the memory bus 223 by the host interface 401.

The scheduler 403 may schedule operations of the memory 250. The scheduler 403 may determine an order of requests which are to be instructed to the memory 250, that were transferred through the memory bus 223. In order to improve the performance, the scheduler 403 may change the order of the requests that are received through the memory bus 223 when operations corresponding to the requests are instructed to the memory 250. For example, even though a read operation of the memory 250 is requested first and then a write operation is requested through the memory bus 223, the order of operations may be changed to perform the write operation of the memory 250 before the read operation.

The command generator 405 may generate a command to be applied to the memory 250 according to the order of operations determined by the scheduler 403.

The memory interface 411 may be used for an interface between the memory controller 221 and the memory 250. The command/address CA may be transferred from the memory controller 221 to the memory 250 through the memory interface 411, and data DATA may be transferred/received. The memory interface 411 may be also referred to as a physical layer (PHY) interface.

The second row hammering detection circuit 407 may select rows that need to be refreshed by counting the activation numbers of all of the rows activated in the security area 333 of the memory 250. The second row hammering detection circuit 407 may be able to detect excessively activated rows by counting the activation numbers of all of the rows that are activated in the security area. Further, the neighboring rows of the excessively activated rows, that is, the rows that are likely to lose data due to row hammering, may be also classified as the rows that need to be refreshed. Since the active operation of the memory 250 is performed according to the command of the memory controller 221, the second row hammering detection circuit 407 of the memory controller 221 may be able to detect which row is activated in the security area 333 of the memory 250. For the rows classified as the rows to be refreshed by the second row hammering detection circuit 407, the memory controller 221 may command the memory 250 to perform an active operation which may also prevent data loss, or a refresh operation. Thus, loss of data corresponding to the rows to be refreshed may be prevented.

Since the second row hammering detection circuit 407 counts the activation numbers of all of the rows of the security area 333 in a full-row counting manner, there may be a lot of burden in operation, but since a size of the security area 333 is relatively small, such an operation may be possible. The second row hammering detection circuit 407 requires a storage circuit for the counting, and one among the cache memories 215, 217 and 219 of the processor 210 may be used as a storage circuit for storing the counting result. Since the last-level cache memory 219 among the cache memories 215, 217 and 219 has the largest capacity, it may be desirable for the second row hammering detection circuit 407 to use the cache memory 219 as a storage circuit. Further, the storage circuit for storing the counting result may be provided in the second row hammering detection circuit 407.

FIG. 5 illustrates an example of a counting result stored in the last-level cache memory 219. Referring to FIG. 5, it may be seen that the activation number is counted for each row of the security area 333. The last-level cache memory 219 may have the lowest-level.

The error correction circuit 409 may be a circuit for error correction of the security area 333. The error correction circuit 409 may generate an error correction code for correcting an error in write data during a write operation of the security area 333 and store the error correction code in one cache memory (i.e., an error correction code storing region) among the cache memories 215, 217 and 219. It may be desirable to store the error correction code in the last-level cache memory 219 among the cache memories 215, 217 and 219. The error correction circuit 409 may correct an error of the data that are read from the security area 333 based on the error correction code which is stored in the cache memory 219 during a read operation of the security area 333. That is, the error correction circuit 409 may store the error correction code for correcting an error of the data that are stored in the security area 333 in the cache memory 219 during a write operation, and during a read operation, the error correction circuit 409 may correct an error in the data that are read from the security area 333 based on the error correction code stored in the cache memory 219.

The memory system 200 may protect the security data stored in the security area 333 by differentiating the normal area 331 and the security area 333 in the following three aspects.

1. Counting of Activated Rows

The activation number of rows that are activated in the normal area 331 may be counted by the first row hammering detection circuit 320 in a random-row counting manner. Since not all of the activated rows are counted but only some rows are randomly selected and counted, this counting method tends to be less reliable. In the normal area 331, the reliability of the method of selecting the rows that are attacked from row hammering may not be 100%.

On the other hand, the activation number of rows that are activated in the security area 333 may be counted by the second row hammering detection circuit 407 in a full-row counting manner. Since all of the rows activated in the security area 333 are counted, the row attacked from row hammering may be selected with almost 100% confidence. Therefore, the data stored in the security area 333 may be more protected than the data stored in the normal area 331.

2. Error Correction Method

The error correction circuit 409 may perform an error correction operation only for the data stored in the security area 333. Therefore, the data stored in the security area 333 may be more protected than the data stored in the normal area 331. Although an additional error correction circuit may be further provided in the memory system 200 in addition to the error correction circuit 409, the error correction circuit may protect both the data stored in the security area 333 and the data stored in the normal area 331. Therefore, there is no change in the fact that the data stored in the security area 333 are more protected than the data stored in the normal area 331.

3. Access Method

The memory 250 may be generally accessed via the cache memories 215, 217 and 219. That is, the processor core 211 does not directly access the memory 250 to obtain data, and data are transferred from the memory 250 to the cache memories 215, 217 and 219. The processor core 211 may access the cache memories 215, 217 and 219 to obtain data. Exceptionally, when the processor core 211 needs to directly access the memory 250 due to a cache flush or other circumstances, the processor core 211 may directly access the memory 250.

Indirect access to the memory 250 and direct access to the memory 250 via these cache memories 215, 217 and 219 may be controlled by the cache controller 213, which allows direct access of the processor core 211 to the normal area 331 of the memory 250, but prohibits direct access of the processor core 211 to the security area 333 of the memory 250.

If the direct access of the processor core 211 to the memory 250 is allowed, the memory 250 may be easily attacked by hackers. However, since the cache controller 213 prohibits the direct access of the processor core 211 to the security area 333 of the memory 250, the security area 333 may be hardly attacked. In short, the data stored in the security area 333 may be protected.

According to the embodiments of the present invention, the capability of defending a memory system from a row hammering attack may be improved.

The effects desired to be obtained in the embodiments of the present invention are not limited to the effects mentioned above, and other effects not mentioned above may also be clearly understood by those of ordinary skill in the art to which the present invention pertains from the description.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A memory system, comprising:
   a normal memory area suitable for storing normal data;
   a security memory area suitable for storing security data; and
   a processor including a cache memory,
   wherein the security memory area is allowed to be accessed, by the processor, only via the cache memory,
   wherein the processor comprises a memory controller including a second row hammering detection circuit that counts activation numbers of rows of the security memory area in a full-row counting manner to detect rows to be refreshed.

2. The memory system of claim 1, wherein the normal memory area and the security memory area are included in a memory.

3. The memory system of claim 1, wherein the normal memory area is allowed to be directly accessed by the processor.

4. The memory system of claim 1, wherein the second row hammering detection circuit stores a counting result corresponding to the rows activated in the security area in a last-level cache memory among the different levels of the cache memories.

5. The memory system of claim 1, wherein the processor further includes a processor core suitable for processing instructions and accessing the memory via the cache memory.

6. The memory system of claim 1, wherein the memory controller further includes:
   a host interface suitable for communicating with a host; and
   a scheduler suitable for scheduling operations of the memory.

7. The memory system of claim 6, wherein the memory controller further includes:
   a command generator suitable for generating a command to be applied to the memory; and
   a memory interface suitable for communicating with the memory.

* * * * *